US007734003B2

(12) United States Patent
Chien et al.

(10) Patent No.: US 7,734,003 B2
(45) Date of Patent: Jun. 8, 2010

(54) SHIFT REGISTER ARRAYS

(75) Inventors: Chih-Yuan Chien, Hsinchu (TW); Yu-Ju Kuo, Hsinchu (TW); Wan-Jung Chen, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 72 days.

(21) Appl. No.: 12/136,186

(22) Filed: Jun. 10, 2008

(65) Prior Publication Data

US 2009/0041177 A1 Feb. 12, 2009

(30) Foreign Application Priority Data

Aug. 7, 2007 (TW) ............................... 96128973 A

(51) Int. Cl.
*G11C 19/00* (2006.01)
(52) U.S. Cl. ............................................. 377/64; 68/69
(58) Field of Classification Search .................. None
See application file for complete search history.

(56) References Cited

U.S. PATENT DOCUMENTS

| 6,970,530 | B1 * | 11/2005 | Wang et al. | 377/69 |
|---|---|---|---|---|
| 7,436,923 | B2 * | 10/2008 | Tobita | 377/64 |
| 2006/0274021 | A1 * | 12/2006 | Park et al. | 345/100 |
| 2008/0012818 | A1 * | 1/2008 | Lee et al. | 345/100 |
| 2008/0080661 | A1 * | 4/2008 | Tobita | 377/78 |
| 2008/0101529 | A1 * | 5/2008 | Tobita | 377/64 |
| 2008/0253499 | A1 * | 10/2008 | Chan et al. | 377/68 |

FOREIGN PATENT DOCUMENTS

| CN | 1953101 | 4/2007 |
|---|---|---|
| CN | 101114525 | 1/2008 |

OTHER PUBLICATIONS

English Abstract of CN101114525.
English Abstract of CN1953101.
"MOS Capacitor Pull-Up Circuits for High-Speed Dynamic Logic" Joseph P. Ellul et al.; IEEE Journal of Solid-State Circuits, vol. SC-10, No. 5, Oct. 1975.
English Abstract of CN101114525; publication dated Jan. 3, 2008.
English of CN1953101; publication date: Apr. 25, 2007.

* cited by examiner

*Primary Examiner*—Tuan Lam
(74) *Attorney, Agent, or Firm*—Thomas, Kayden, Horstemeyer & Risley

(57) ABSTRACT

A shift register array is provided. The shift register array includes a plurality of shift registers connected in serial. The shift register includes a first transistor coupled between a first input terminal and a first node, a second transistor coupled between a first clock input terminal and an output terminal and a pull-up unit. The first transistor has a gate coupled to the first input terminal. The second transistor has a gate coupled to the first node. The pull-up unit includes a third transistor coupled between the first node and a ground, a capacitor coupled between the first clock input terminal and the second node and a fourth transistor coupled between the second node and the ground. The third transistor has a gate coupled to a second node. The fourth transistor has a gate coupled to the first node.

13 Claims, 8 Drawing Sheets

SHIFT REGISTER ARRAYS

CROSS REFERENCE TO RELATED APPLICATIONS

This application claims priority of Taiwan Patent Application No. 096128973, filed on Aug. 7, 2007, the entirety of which is incorporated by reference herein.

BACKGROUND OF THE INVENTION

1. Field of the Invention

The invention relates to a shift register, and more particularly to a shift register array of a liquid crystal display apparatus.

2. Description of the Related Art

At present, gate drivers and source drivers of most of the liquid crystal displays are disposed outside of the liquid crystal display panels, and are configured to generate gate pulse signals and data signals, respectively. However, using gate drivers increases costs. In order to reduce costs, the shift register arrays, which function as gate drivers, are fabricated on a glass substrate, i.e. an integrated driving circuit. An amorphous thin film transistor (TFT) process is often used in an active matrix liquid crystal display (AMLCD). Therefore, given the above, for an AMLCD panel, the panel may abnormally operate due to stress problems of the shift registers after the panel is illuminated.

FIG. 1 shows a circuit diagram of a conventional shift register. In FIG. 1, only a single shift register 100 is shown. A plurality of shift registers 100 can form a shift register array, which functions as a gate driver. As shown in FIG. 1, the shift register 100 comprises a transistor 101, a transistor 102, a pull-up unit 110, a pull-down unit 120 and a transistor 106. The transistor 101 is coupled to a node N10 and receives a gate pulse signal $Gate_{N-1}$ output from a previous stage shift register. The transistor 102 receives a clock signal CK and outputs a gate pulse signal $Gate_N$ of the shift register 100 according a voltage of the node N10. The pull-down unit 120 is coupled between the transistor 102 and a ground VSS. The pull-up unit 110 is coupled between the node N10 and the ground VSS and comprises three transistors 103-105. The transistor 103 is coupled between the node N10 and the ground VSS and has a gate coupled to a node N11. The transistor 104 is coupled between the node N11 and a power VDD and has a gate coupled to the power VDD such that a diode-connected transistor 104 is formed. The transistor 105 is coupled between the node N11 and the ground VSS and has a gate coupled to the node N10. Hence, the transistors 104 and 105 can form a dynamic inverter.

Furthermore, the transistor 106 is coupled between the node N10 and the ground VSS and has a gate for receiving a gate pulse signal $Gate_{N+1}$ output from a next stage shift register. However, for the shift register 100, it does not matter if the gate pulse signal $Gate_{N-1}$ or the clock signal CK are active or not, the transistor 104 will always be turned on, thus shortening operating lifespan of the transistor 104 and possibly causing damage.

BRIEF SUMMARY OF THE INVENTION

A shift register array is provided. An exemplary embodiment of such a shift register array comprises a plurality of shift registers connected in serial, wherein the shift register comprises a first transistor, a second transistor and a pull-up unit. The first transistor has a first gate coupled to a first input terminal, a first terminal coupled to the first input terminal and a second terminal coupled to a first node. The second transistor has a second gate coupled to the first node, a third terminal coupled to a first clock input terminal and a fourth terminal coupled to an output terminal. The pull-up unit comprises a third transistor, a capacitor and a fourth transistor. The third transistor is coupled between the first node and a ground and has a third gate coupled to a second node. The capacitor is coupled between the first clock input terminal and the second node. The fourth transistor is coupled between the second node and the ground and has a fourth gate coupled to the first node.

Furthermore, another exemplary embodiment of a shift register array is provided, comprising a plurality of shift registers connected in serial, wherein the shift register comprises a first transistor, a second transistor, a pull-up unit and a fifth transistor. The first transistor has a first gate coupled to a first input terminal, a first terminal coupled to the first input terminal and a second terminal coupled to a first node. The second transistor has a second gate coupled to the first node, a third terminal coupled to a first clock input terminal and a fourth terminal coupled to an output terminal. The pull-up unit comprises a third transistor, a capacitor and a fourth transistor. The third transistor is coupled between the first node and a ground and has a third gate coupled to a second node. The first capacitor is coupled between the first clock input terminal and the second node. The fourth transistor is coupled between the second node and the ground and has a fourth gate coupled to the first node. The fifth transistor is coupled between the output terminal and the ground and has a fifth gate coupled to a second clock input terminal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
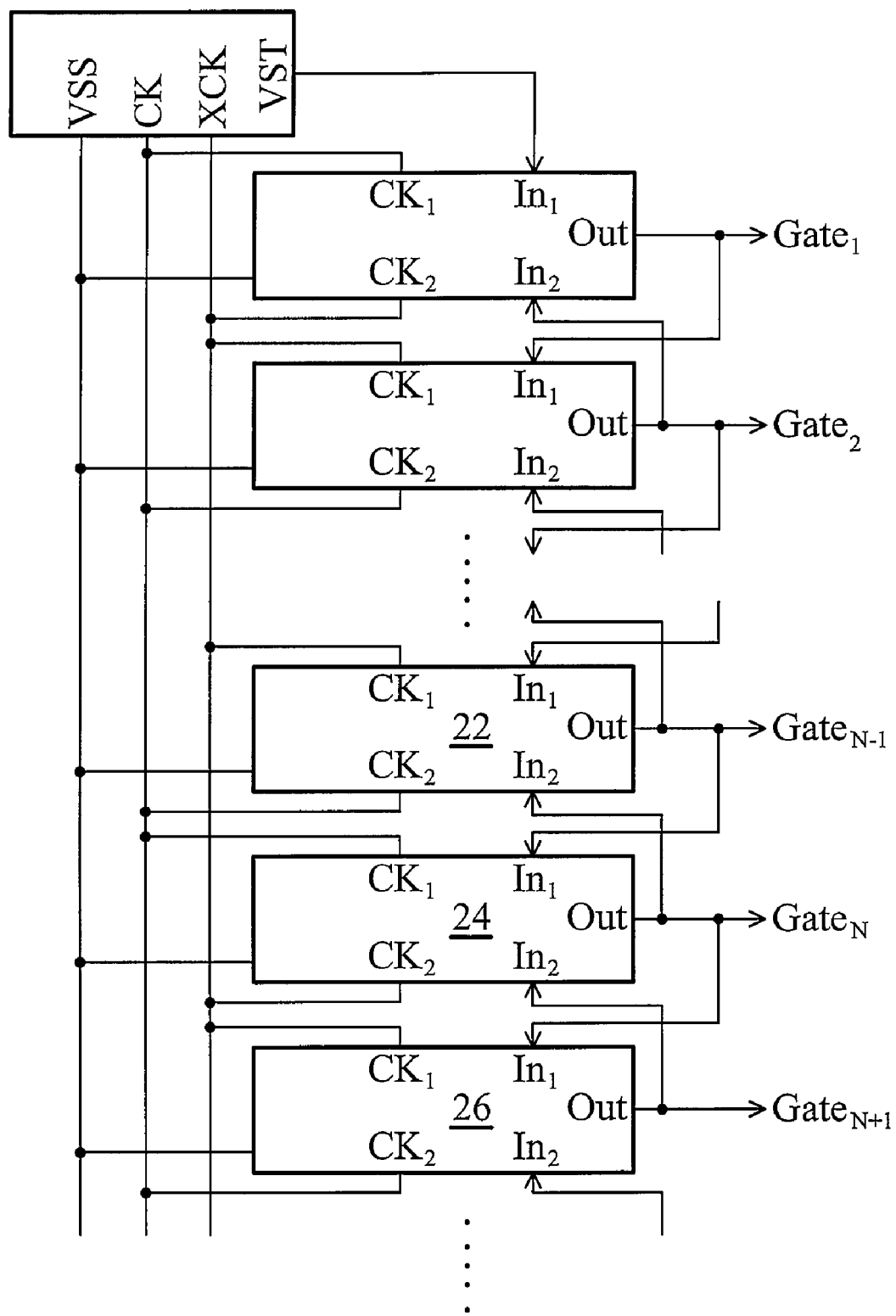
FIG. 2A shows a shift register array according to an embodiment of the invention.

FIG. 2A shows a shift register array 20 according to an embodiment of the present invention. The shift register array 20 is composed of a plurality of shift registers connected in serial, wherein each shift register has the same circuit. A single shift register will be described in detail below. As shown in FIG. 2A, an input terminal $In_1$ of a shift register 24 is coupled to an output terminal Out of a previous stage shift register 22 to receive a gate pulse signal $GATE_{N-1}$, and an input terminal $In_2$ of the shift register 24 is coupled to an output terminal Out of a next stage shift register 26 to receive a gate pulse signal $GATE_{N+1}$. Moreover, an output terminal of the shift register 24 is coupled to an input terminal $In_1$ of the next stage shift register 26 to send a gate pulse signal $GATE_N$ to the next stage shift register 26. In addition, the clock input terminals $CK_1$ and $CK_2$ of the shift register 24 are separately coupled to the clock signals CK and XCK, and the clock input terminals $CK_1$ and $CK_2$ of the shift register 26 are separately coupled to the clock signals XCK and CK, wherein the clock signal XCK is inverted with respect to the clock signal CK.

Figure 2B:
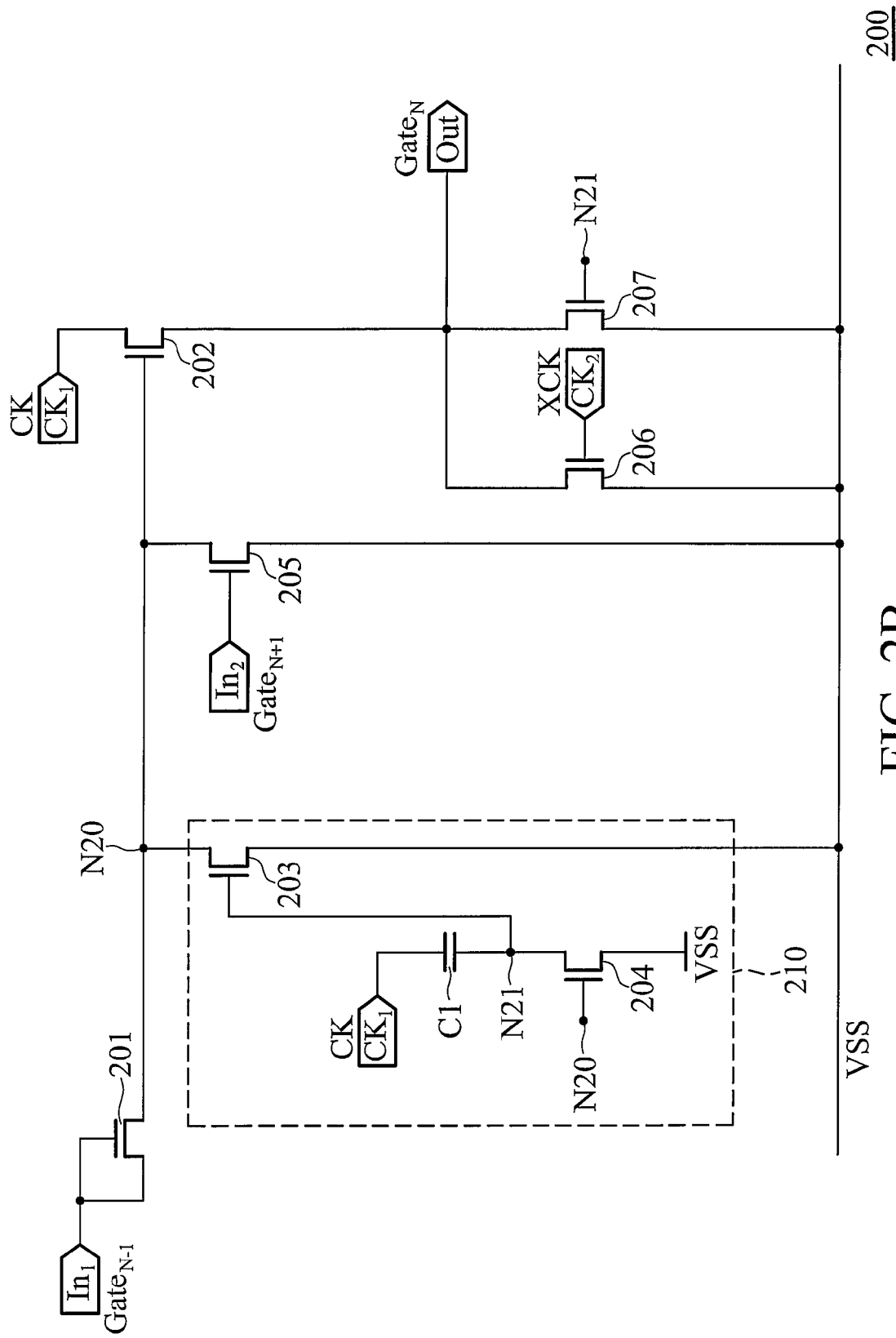
FIG. 2B shows a single shift register of the shift register array shown in FIG. 2A.

FIG. 2B shows a single shift register 200 of the shift register array 20 in FIG. 2A. In this embodiment, the shift register 200 will be illustrated by using the shift register 24 in FIG. 2A as an example. The shift register 200 comprises transistors 201, 202, 205-207 and a pull-up unit 210. The transistor 201 is coupled between a node N20 and the input terminal $In_1$ and receives the gate pulse signal $GATE_{N-1}$ output from a previous stage shift register (such as the shift register 22), wherein the transistor 201 has a gate coupled to the input terminal $In_1$. The transistor 202 is coupled between the clock input terminal $CK_1$ and the output terminal Out and has a gate coupled to the node N20. The transistor 202 receives the clock signal CK and outputs the gate pulse signal $GATE_N$ of the shift register 200 according to a voltage of the node N20. The transistor 205 is coupled between the node N20 and the ground VSS and has a gate coupled to the input terminal $In_2$ for receiving the gate pulse signal $GATE_{N+1}$ output from a next stage shift register (such as the shift register 26). The transistor 206 is coupled between the output terminal Out and the ground VSS and has a gate coupled to the clock input terminal $CK_2$ for receiving the clock signal XCK.

The pull-up unit 210 comprises a transistor 203, a capacitor C1 and a transistor 204. The transistor 203 is coupled between the node N20 and the ground VSS and has a gate coupled to a node N21. The capacitor C1 is coupled between the clock input terminal $CK_1$ and the node N21, and the transistor 204 is coupled between the node N21 and the ground VSS and has a gate coupled to the node N20. The transistor 207 is coupled between the output terminal Out and the ground VSS and has a gate coupled to the node N21 of the pull-up unit 210. Furthermore, all of the transistors are N type thin-film transistors in FIG. 2B.

Figure 2C:
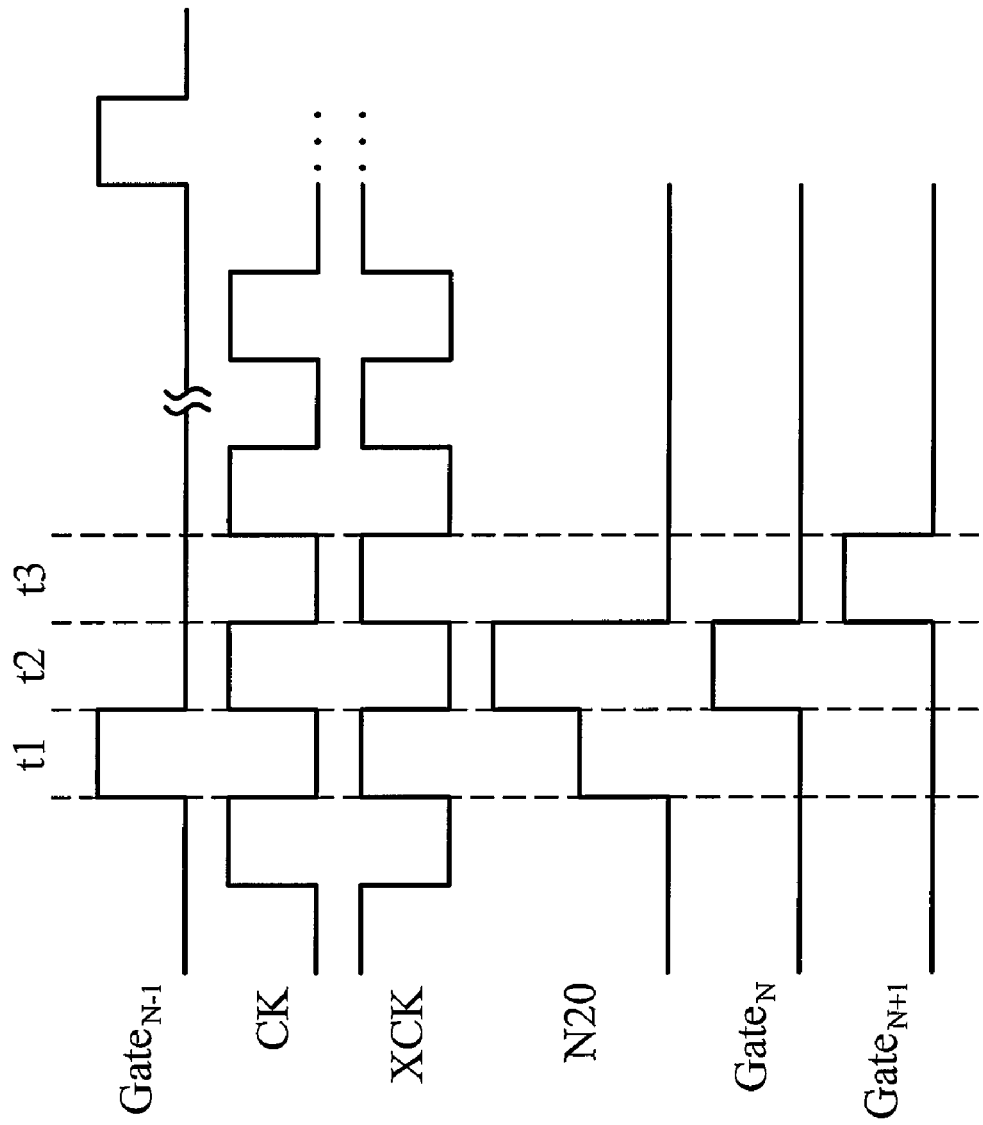
FIG. 2C shows a timing diagram of the shift register shown in FIG. 2A according to an embodiment of the invention.

FIG. 2C shows a timing diagram of the shift register 200 according to an embodiment of the invention. First, during period t1, the gate pulse signal $GATE_{N-1}$ of the previous stage shift register is at a high voltage level, and the gate pulse signal $GATE_{N-1}$ is sent to the transistor 201 through the input terminal $In_1$ to turn on the transistor 201 such that the node N20 has a first voltage level. Next, during period t2, the clock signal CK is changed from a low to high voltage level and is sent to a drain of the transistor 202 (i.e. the clock input terminal $CK_1$) such that the gate pulse signal $GATE_N$ is also changed from a low to high voltage level. For the transistor 202, the drain (i.e. the node 20) is in a floating status. If a voltage of the drain of the transistor 202 is increased in response to the clock signal CK, the voltage of the node 20 is increased to a second voltage level due to a coupling effect. Next, during period t3, the gate pulse signal $GATE_{N+1}$ output from the next stage shift register is at a high voltage level and is sent to the input terminal $In_2$, such that the transistor 205 is turned on and then the node N20 is electrically connected to the ground VSS. Simultaneously, the clock signal XCK is changed from a low to high voltage level and is sent to the clock input terminal $CK_2$. Therefore, the transistor 206 is turned on and then the output terminal Out is electrically connected to the ground VSS such that the gate pulse signal $GATE_N$ is changed to a low voltage level.

Figure 1:
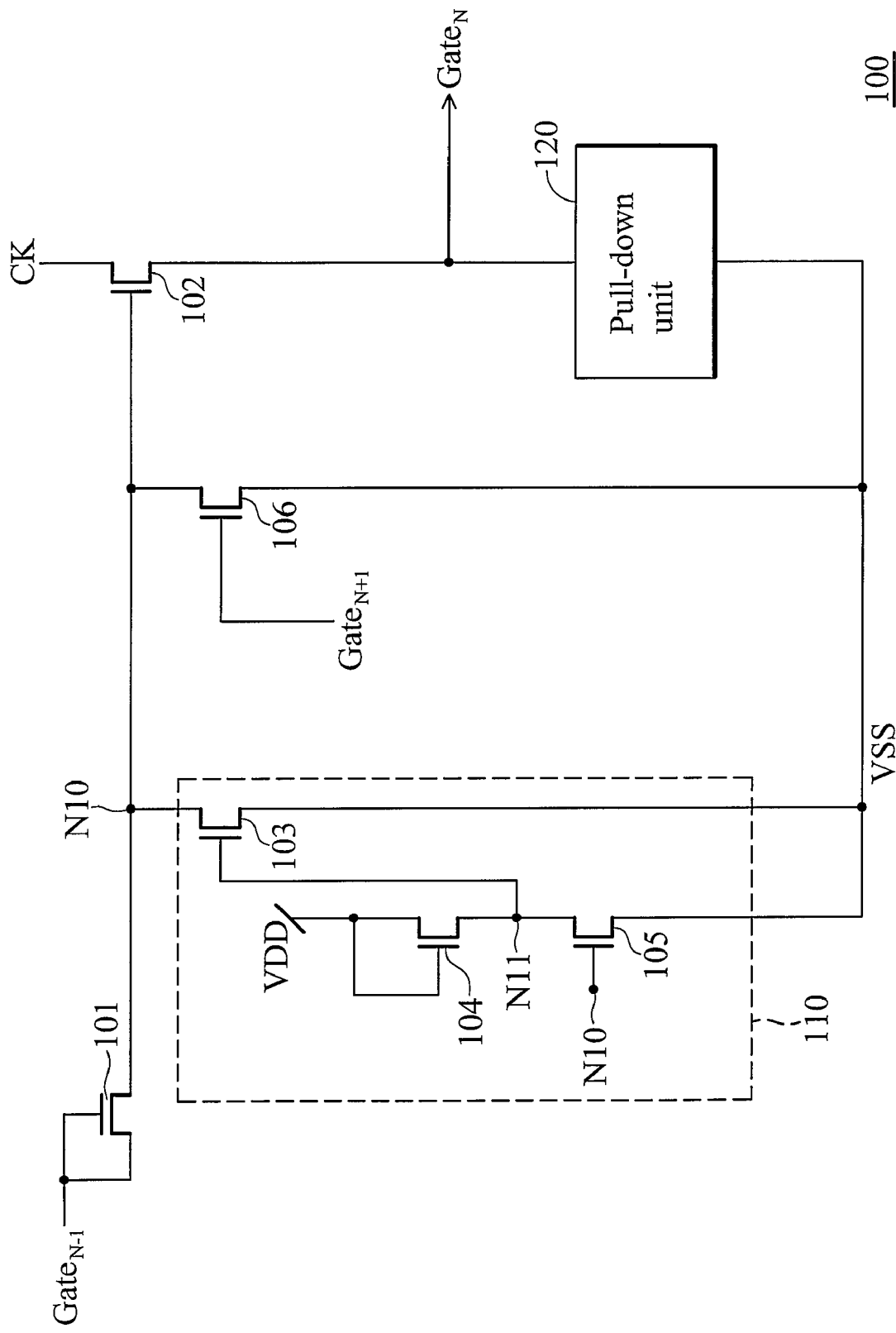
FIG. 1 shows a circuit diagram of a conventional shift register.

In this embodiment, the pull-up unit 210 uses the capacitor C1 to replace a diode-connected transistor (such as the transistor 104 in FIG. 1), and uses the clock coupling effect to function as a conventional dynamic inverter to solve the stress problems in the conventional art.

Figure 3A:
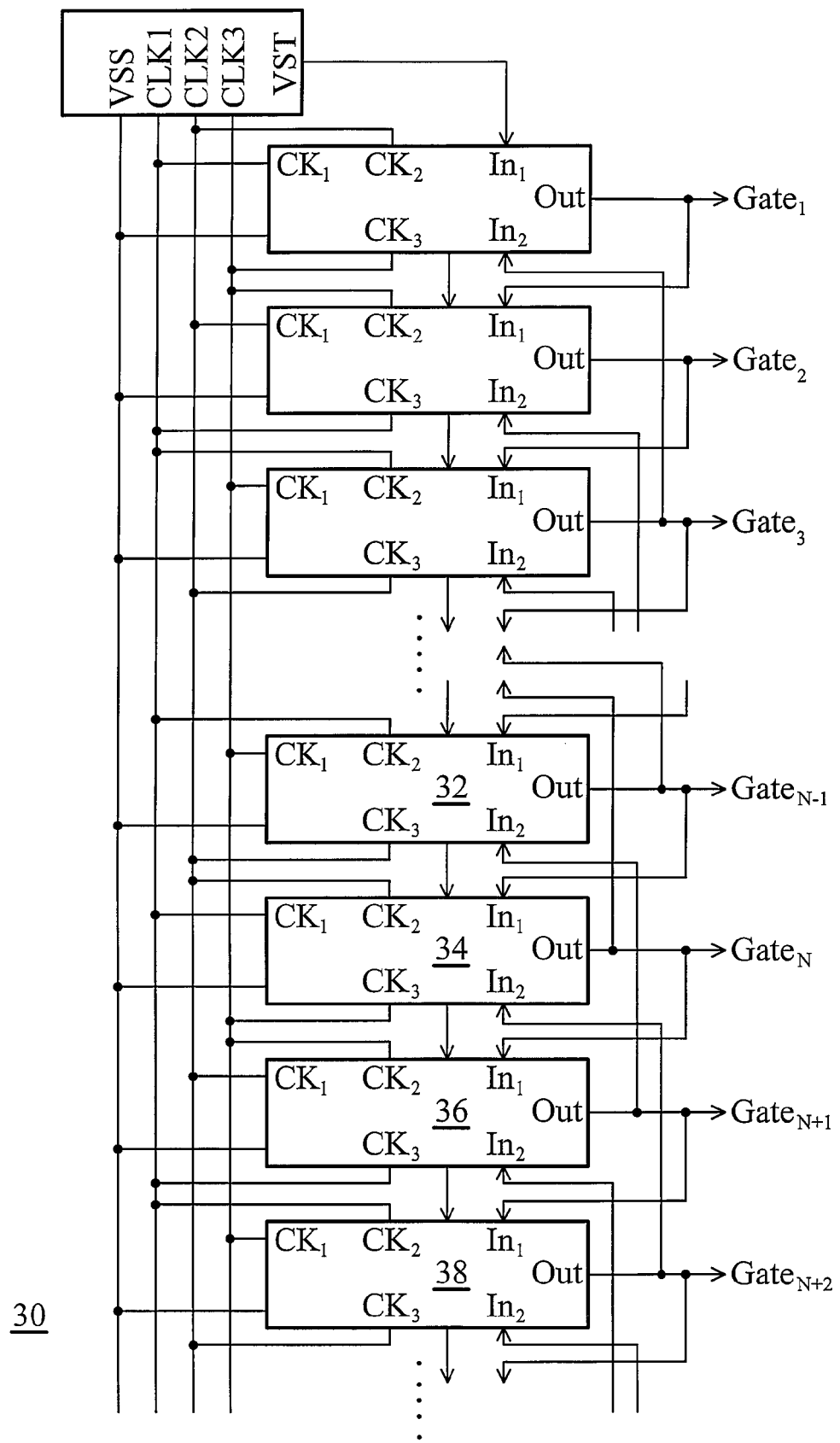
FIG. 3A shows a shift register array according to another embodiment of the invention.

FIG. 3A shows a shift register array 30 according to another embodiment of the invention. The shift register array 30 is composed of a plurality of shift registers connected in serial, and a single shift register will be described in detail below. As shown in FIG. 3A, an input terminal $In_1$ of the shift register 34 is coupled to an output terminal Out of a previous stage shift register 32 to receive a gate pulse signal $GATE_{N-1}$, and an input terminal $In_2$ of the shift register 34 is coupled to an output terminal Out of a one after the next stage shift register 38 to receive a gate pulse signal $GATE_{N+2}$. Moreover, an output terminal of the shift register 34 is coupled to an input terminal $In_1$ of a next stage shift register 36 to send a gate pulse signal $GATE_N$ to the next stage shift register 36. Furthermore, an output terminal of the next stage shift register 36 is coupled to an input terminal $In_1$ of the one after the next stage shift register 38 to send a gate pulse signal $GATE_{N+1}$ to the one after the next stage shift register 38. For the shift register 34, the clock input terminals $CK_1$, $CK_2$ and $CK_3$ are coupled to the clock signals CLK1, CLK2 and CLK3, respectively. In addition, the clock input terminals $CK_1$, $CK_2$ and $CK_3$ of the previous stage shift register 32 are separately coupled to the clock signals CLK3, CLK1 and CLK2, and the clock input terminals $CK_1$, $CK_2$ and $CK_3$ of the shift register 36 are separately coupled to the clock signals CLK2, CLK3 and CLK1.

Figure 3B:
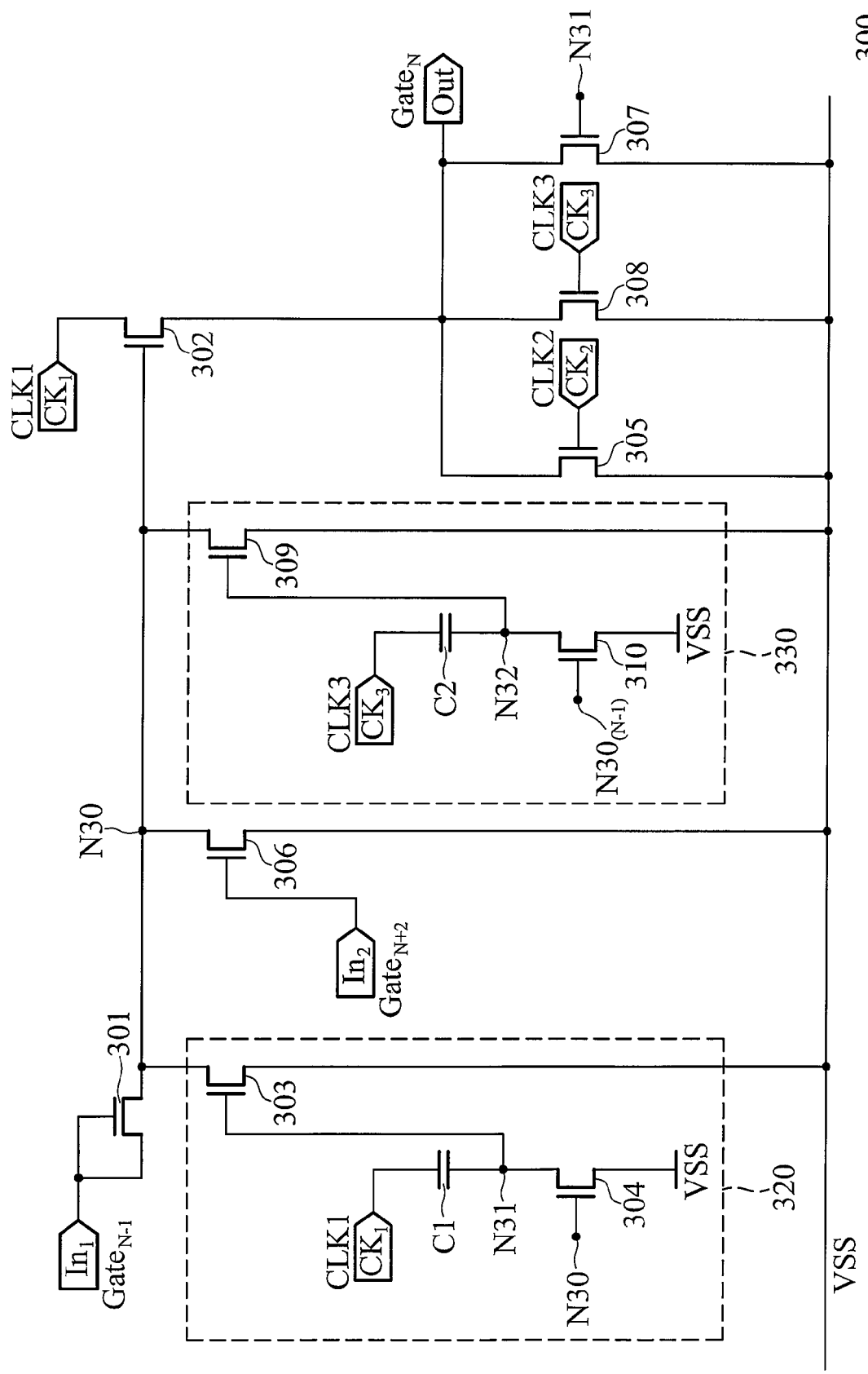
FIG. 3B shows a single shift register of the shift register array shown in FIG. 3A.

FIG. 3B shows a single shift register 300 of the shift register array 30 in FIG. 3A. In this embodiment, the shift register 300 will be illustrated by using the shift register 34 in FIG. 3A as an example. The shift register 300 comprises transistors 301, 302, 305-308 and two pull-up units 320 and 330. The transistor 301 is coupled between a node N30 and the input terminal $In_1$ to receive the gate pulse signal $GATE_{N-1}$ output from a previous stage shift register (such as the shift register 32), wherein the transistor 301 has a gate coupled to the input terminal $In_1$. The transistor 302 is coupled between the clock input terminal $CK_1$ and the output terminal Out and has a gate coupled to the node N30. The transistor 302 receives the clock signal CLK1 and outputs the gate pulse signal $GATE_N$ of the shift register 300 according to a voltage of the node N30. The transistor 306 is coupled between the node N30 and the ground VSS and has a gate coupled to the input terminal $In_2$ for receiving the gate pulse signal $GATE_{N+2}$ output from the one after the next stage shift register (such as the shift register 38). The transistor 305 is coupled between the output terminal Out and the ground VSS and has a gate coupled to a clock input terminal $CK_2$ for receiving the clock signal CLK2. Moreover, the transistor 308 is also coupled between the output terminal Out and the ground VSS and has a gate coupled to a clock input terminal $CK_3$ for receiving the clock signal CLK3.

In addition, the pull-up unit 320 comprises a transistor 303, a capacitor C1 and a transistor 304. The transistor 303 is coupled between the node N30 and the ground VSS and has a gate coupled to a node N31. The capacitor C1 is coupled between the clock input terminal CK, and the node N31, and the transistor 304 is coupled between the node N31 and the ground VSS and has a gate coupled to the node N30. The transistor 307 is coupled between the output terminal Out and the ground VSS and has a gate coupled to the node N31 of the pull-up unit 320. Furthermore, the pull-up unit 330 comprises a transistor 309, a capacitor C2 and a transistor 310. The transistor 309 is coupled between the node N30 and the ground VSS and has a gate coupled to a node N32. The capacitor C2 is coupled between the clock input terminal $CK_3$ and the node N32, and the transistor 310 is coupled between the node N32 and the ground VSS and has a gate coupled to a node $N30_{(N-1)}$ of a previous stage shift register (such as the shift register 32). In FIG. 3B, all of the transistors are N type thin-film transistors.

Figure 3C:
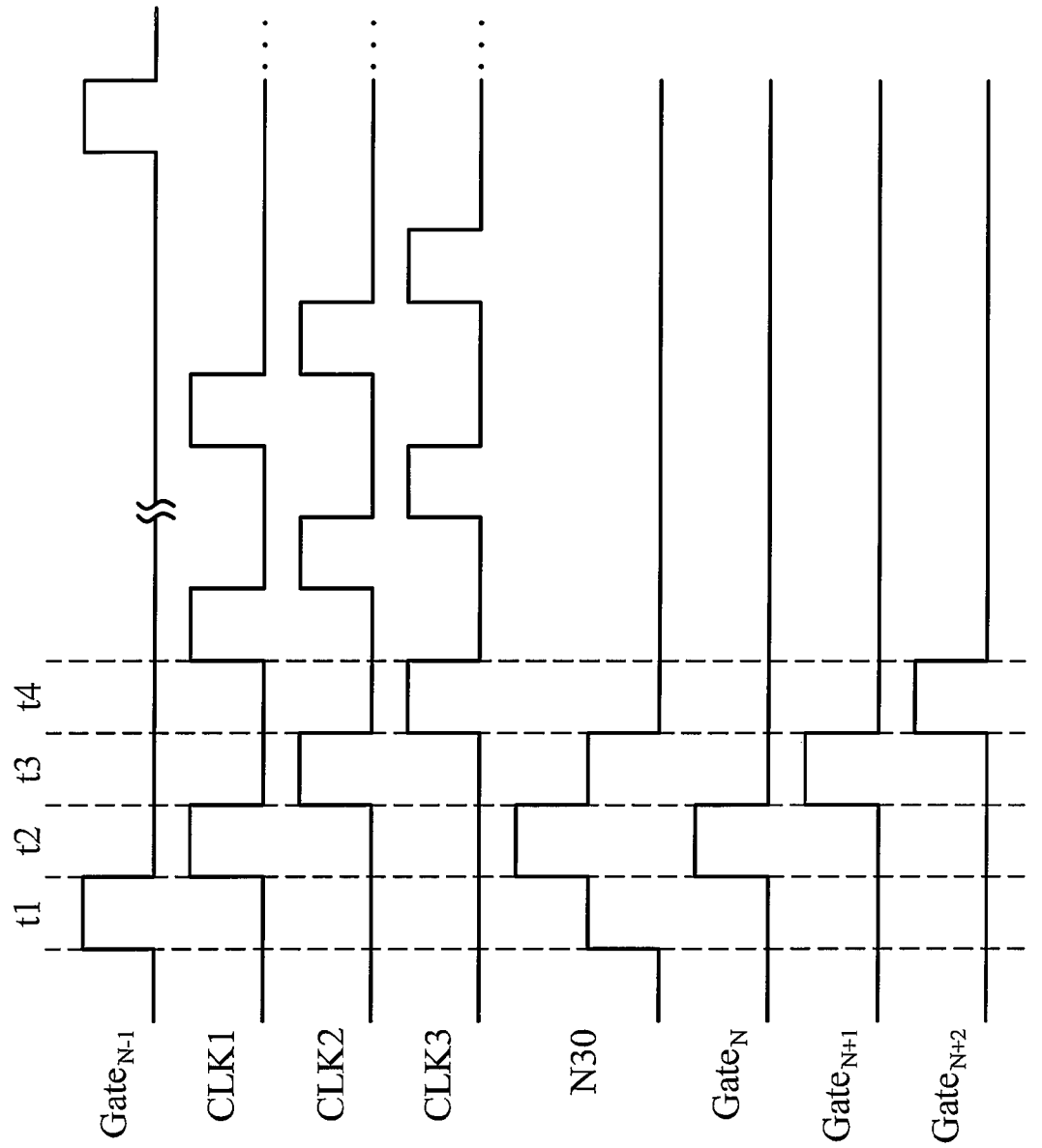
FIG. 3C shows a timing diagram of the shift register shown in FIG. 3A according to an embodiment of the invention.

FIG. 3C shows a timing diagram of the shift register 300 according to an embodiment of the invention. First, during period t1, the gate pulse signal $GATE_{N-1}$ of the previous stage shift register is at a high voltage level, and the gate pulse signal $GATE_{N-1}$ is sent to the transistor 301 through the input terminal $In_1$ to turn on the transistor 301 such that the node N30 has a first voltage level. Next, during period t2, the clock signal CLK1 is changed from a low to high voltage level and is sent to a drain of the transistor 302 (i.e. the clock input terminal $CK_1$) such that the gate pulse signal $GATE_N$ is also changed from a low to high voltage level. If a voltage of the drain of the transistor 302 is increased in response to the clock signal CLK1, a voltage of the gate of the transistor 302 (i.e. the voltage of the node 30) is increased to a second voltage level due to the coupling effect. Next, during period t3, the clock signal CLK1 is changed from high to low voltage level. Similarly, the voltage of the node 30 is decreased to the first voltage. Simultaneously, the clock signal CLK2 is changed from a low to high voltage level and is sent to the clock input terminal $CK_2$. Therefore, the transistor 305 is turned on and then the output terminal Out is electrically connected to the ground VSS, such that the gate pulse signal $GATE_N$ is changed to a low voltage level. Next, during period t4, the gate pulse signal $GATE_{N+2}$ output from the one after the next stage shift register is at a high voltage level and is sent to the input terminal $In_2$, such that the transistor 306 is turned on and then the node N30 is electrically connected to the ground VSS. Simultaneously, the clock signal CLK3 is changed from a low to high voltage level to turn on the transistor 308, such that the gate pulse signal $GATE_N$ is still held in a low voltage level.

Figure 3D:
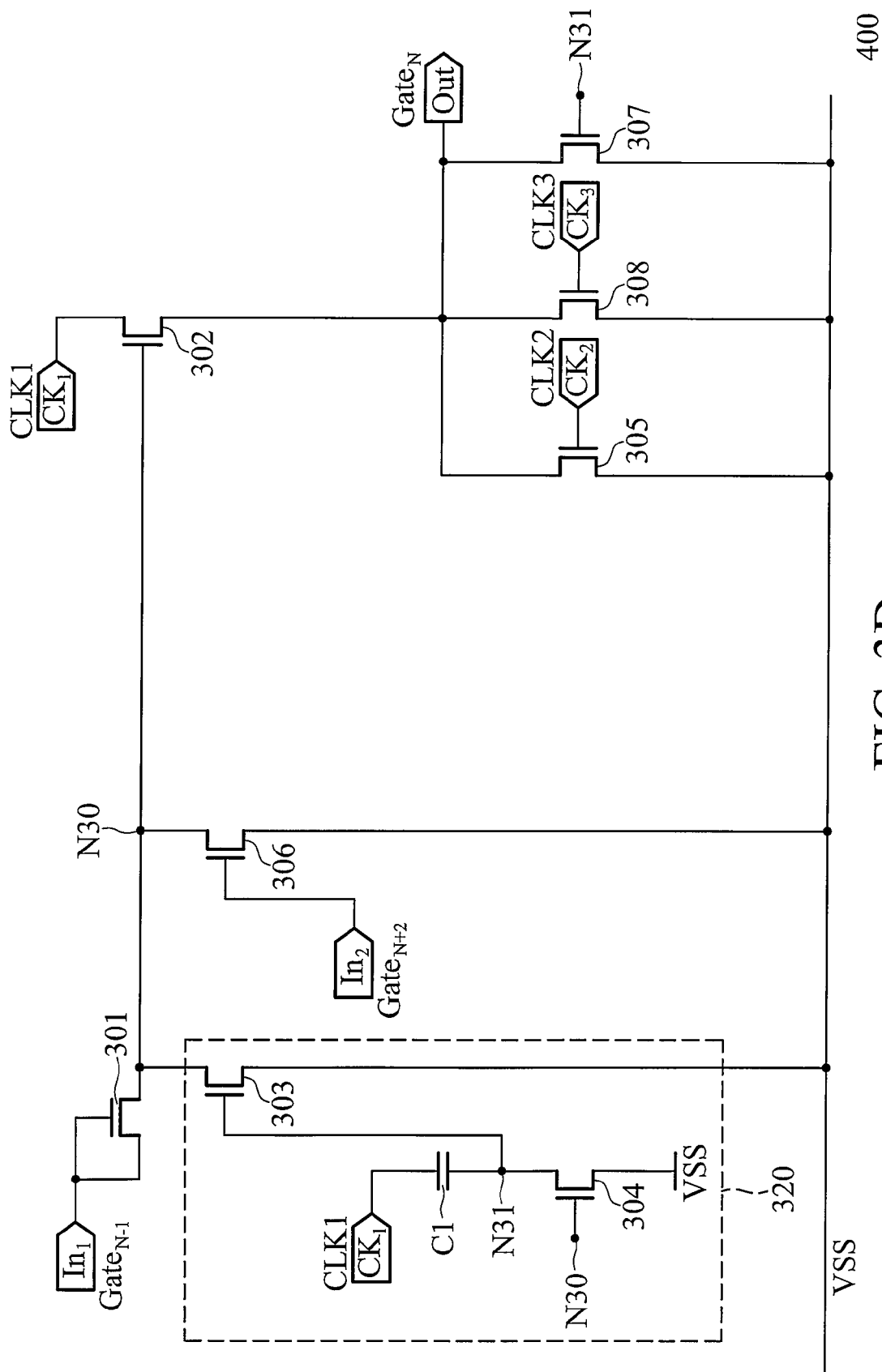
FIG. 3D shows a shift register according to another embodiment of the invention

FIG. 3D shows a shift register 400 according to another embodiment of the invention. Compared with the shift register 300 in FIG. 3B, the shift register 400 only comprises the transistors 301-302 and 305-308 and the pull-up unit 320. As shown in FIG. 3D, the shift register 400 only uses one pull-up unit in order to reduce the circuit layout area.

In the embodiment of the invention, the amount of the clock signals is increased, which will reduce the operational time of each transistor and then enhance the reliability of the shift registers. As shown in FIG. 3C, the clock signals CLK1, CLK2 and CLK3 have the same frequency and duty cycle. In a preferred embodiment of the invention, the duty cycle of each clock signal is about ⅓. A phase of the clock signal CLK3 is directed to lag behind that of the clock signal CLK2 and their phase difference is 120 degrees, and the phase of the clock signal CLK2 is directed to lag behind that of the clock signal CLK1 and their phase difference is 120 degrees.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A shift register array comprising a plurality of shift registers connected in serial, wherein each of the shift registers comprises:
   a first transistor having a first gate coupled to a first input terminal, a first terminal coupled to the first input terminal and a second terminal coupled to a first node;
   a second transistor having a second gate coupled to the first node, a third terminal coupled to a first clock input terminal and a fourth terminal coupled to an output terminal;
   a first pull-up unit, comprising:
      a third transistor coupled between the first node and a ground, having a third gate coupled to a second node;
      a first capacitor coupled between the first clock input terminal and the second node; and
      a fourth transistor coupled between the second node and the ground, having a fourth gate coupled to the first node;
   a fifth transistor, coupled between the output terminal and the ground, having a fifth gate coupled to a second clock input terminal; and
   a sixth transistor, coupled between the output terminal and the ground, having a sixth gate coupled to a third clock input terminal.

2. The shift register array as claimed in claim 1, wherein each shift register further comprises a seventh transistor, which is coupled between the first node and the ground and has a seventh gate coupled to a second input terminal, wherein the first input terminal is coupled to an output terminal of a previous stage shift register, and the second input terminal is coupled to an output terminal of a one after the next stage shift register, and the output terminal is coupled to a first input terminal of a next stage shift register, and an output terminal of the next stage shift register is coupled to a first input terminal of the one after the next stage shift register.

3. The shift register array as claimed in claim 2, wherein each shift register further comprises an eighth transistor, which is coupled between the output terminal and the ground and has an eighth gate coupled to the second node.

4. The shift register array as claimed in claim 1, wherein the first, second and third clock input terminals are coupled to a first, second and third clock signals, respectively.

5. The shift register array as claimed in claim 4, wherein each shift register further comprises a second pull-up unit, the second pull-up unit comprising:
   a ninth transistor coupled between the first node and the ground, having a ninth gate coupled to a third node;
   a second capacitor coupled between the third clock input terminal and the third node; and
   a tenth transistor coupled between the third node and the ground, having a tenth gate coupled to a first node of the previous stage shift register.

6. The shift register array as claimed in claim 4, wherein the first, second and third clock signals have the same frequency.

7. The shift register array as claimed in claim 6, wherein the first, second and third clock signals have the same duty cycle.

8. The shift register array as claimed in claim 7, wherein the duty cycle of the first clock signal is ⅓.

9. The shift register array as claimed in claim 8, wherein a phase of the third clock signal is directed to lag behind that of the second clock signal and a phase difference between the third and second clock signals is 120 degrees, and the phase of the second clock signal is directed to lag behind that of the first clock signal and a phase difference between the second and first clock signals is 120 degrees.

10. The shift register array as claimed in claim 4, wherein the previous stage shift register has a first, second and third clock input terminals, and the first, second and third clock input terminals of the previous stage shift register are coupled to the third, first and second clock signals, respectively.

11. The shift register array as claimed in claim 4, wherein the next stage shift register has a first, second and third clock input terminals, and the first, second and third clock input terminals of the next stage shift register are coupled to the second, third and first clock signals, respectively.

12. The shift register array as claimed in claim 5, wherein each of the transistors is an N type thin-film transistor.

13. A shift register array comprising a plurality of shift registers connected in serial, wherein each of the shift registers comprises:
- a first transistor having a first gate coupled to a first input terminal, a first terminal coupled to the first input terminal and a second terminal coupled to a first node;
- a second transistor having a second gate coupled to the first node, a third terminal coupled to a first clock input terminal and a fourth terminal coupled to an output terminal;
- a first pull-up unit, comprising:
  - a third transistor coupled between the first node and a ground, having a third gate coupled to a second node;
  - a first capacitor coupled between the first clock input terminal and the second node; and
  - a fourth transistor coupled between the second node and the ground, having a fourth gate coupled to the first node;
- a fifth transistor, coupled between the output terminal and the ground, having a fifth gate coupled to a second clock input terminal; and
- a sixth transistor, coupled between the output terminal and the ground, having an sixth gate coupled to a third clock input terminal, wherein the first, second and third clock input terminals are coupled to a first, second and third clock signals, respectively, and the first, second and third clock signals have the same frequency.

* * * * *